United States Patent [19]
Zele et al.

[11] Patent Number: 5,699,006
[45] Date of Patent: Dec. 16, 1997

[54] DC BLOCKING APPARATUS AND TECHNIQUE FOR SAMPLED DATA FILTERS

[75] Inventors: Rajesh H. Zele, Plantation; Walter H. Kehler; Norman T. Rollins, both of Sunrise, all of Fla.

[73] Assignee: Motorola, Inc., Schaumburg, Ill.

[21] Appl. No.: 678,931

[22] Filed: Jul. 12, 1996

[51] Int. Cl.$^6$ ............................ H03K 5/00; H03F 3/04
[52] U.S. Cl. .................. 327/341; 327/554; 327/552; 327/345; 330/9; 330/107; 333/173
[58] Field of Search ........................ 327/552, 553, 327/554, 558, 307, 334, 336, 337, 344, 341, 345; 330/9, 108, 107; 333/173

[56] References Cited

U.S. PATENT DOCUMENTS

| | | | |
|---|---|---|---|
| 4,996,529 | 2/1991 | Connell | 341/118 |
| 5,182,522 | 1/1993 | Tanigawa et al. | 327/552 |
| 5,389,839 | 2/1995 | Heck | 327/552 |

OTHER PUBLICATIONS

A Parasitic–Insensitive Area–Efficient Approach to Realizing Very Large Time Constants in Switched–Capacitor Circuits, K. Nagaraj, IEEE Transactions on Circuits and Systems, vol. 36, No. 9, Sep. 1989.
Khorramadadi, H. and Gray, P.R., "High–Frequency CMOS Continuous–time Filters," *IEEE* Solid State Circuits, vol. SC–19, No. 6, pp. 939–948, Dec. 1984.
Allstot,D.J., Brodersen, R.W. and Gray, P.R., "MOS Switched Capacitor Ladder Filters," IEEE Solid State Circuits, vol. SC–13, pp. 806–814, Dec. 1978.

*Primary Examiner*—Timothy P. Callahan
*Assistant Examiner*—Dinh T. Le
*Attorney, Agent, or Firm*—Barbara R. Doutre

[57] ABSTRACT

A sampled data filter (400) provides on-chip blocking of DC signals. The addition of a very long time constant (VLTC) integrator (412) into the negative feedback path (414) of a first sampled data integrator (402) provides a lower corner frequency (502) with a zero at DC. The lower corner frequency (502) is adjustable while the desired frequency response is maintained.

13 Claims, 6 Drawing Sheets

DC BLOCKING APPARATUS AND TECHNIQUE FOR SAMPLED DATA FILTERS

TECHNICAL FIELD

This invention relates in general to integrated sampled data filters and more particularly to DC blocking in integrated circuits in which sampled data filters are used.

BACKGROUND

An example of a sampled data integrator is the switched-capacitor integrator. Switched-capacitor lossless integrators, such as that shown in FIG. 1, have been used extensively in integrated circuit (IC) designs. Using a switched-capacitor overcomes process tolerance variations incurred with other combinations of resistors and capacitors. In operation, capacitor C1 is charged at a periodic rate, $f_{clock}$, through alternate charging paths with the time constant for the switched-capacitor integrator 100 being approximated by:

$$\tau = \frac{C2}{f_{clock} \cdot C1}$$

Since the time constant is a function of the capacitance ratio all process variations cancel out. Additional inputs can be achieved in switched-capacitor integrator 100 by coupling additional capacitors, such as capacitor C3, at node 102. The value of capacitor C3 is selected to be equivalent to the value of capacitor C1 and is switched at the same periodic rate, $f_{clock}$, maintaining the same time constant. A summing junction is thus created between the multiple input ports $V_{in1}^+$, $V_{in1}^-$, $V_{in2}^+$, $V_{in2}^-$.

Switched-capacitor integrator circuits are often used in the design of integrated ladder filters. FIG. 2 shows a simplified block diagram of an integrated sampled data ladder filter 200 where each block represents a switched-capacitor integrator with $k_i$ representing its unity gain frequency. Filter 200 represents a general switched-capacitor low pass filter. Filter 200 can be used in various applications, such as noise and audio signal processing in radio receivers.

FIG. 3 shows a typical simulated frequency response curve 300 for a two-pole switched-capacitor low pass filter. Frequency response curve 300 is shown in terms of frequency in hertz (Hz) along the horizontal axis versus gain in decibels (dB) along the vertical axis, having a corner frequency $f_d$, 302.

Various stages of a radio may generate DC offsets and many radio circuits, such as squelch and audio circuits, may have their performance degraded by the presence of such offsets. It is not unusual to find the ladder filter 200 coupled between two stages in which one stage is generating an AC signal with DC offsets while the other stage is sensitive to these offsets. Any DC offset incurred at the input, Vin, of ladder filter 200 will remain present at the output, Vout. In the past, these DC offsets have been blocked through the use of discrete capacitors located externally to the chip, either before or after the filter 200. While this practice is adequate when different stages of the radio circuitry are located on separate integrated circuits (IC)s, there is an issue when the circuitry is to remain on-chip, as the blocking capacitors which are needed to achieve a low corner frequency are too large or impractical to integrate.

With the trend towards increased integration, the ability to go off-chip to couple to an external component creates several design issues. Space and size constraints are limited and every pin-out increases the cost of the IC. Accordingly, there is a need for an on-chip DC blocking circuit for use in integrated sampled data filters.

DETAILED DESCRIPTION OF THE PREFERRED EMBODIMENT

Figure 4:
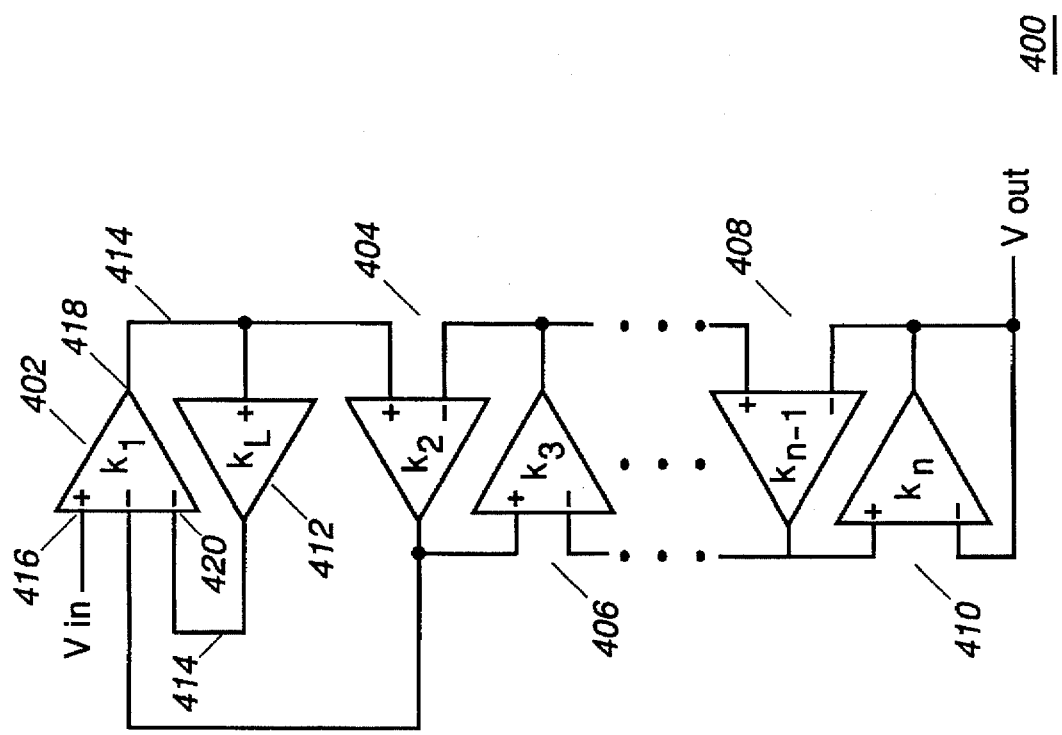
FIG. 4 is an integrated sampled data ladder filter incorporating DC blocking in accordance with the present invention.

Referring now to FIG. 4, there is shown a block diagram of a sampled data filter 400 providing on-chip DC blocking in accordance with the present invention. Filter 400 is formed of a plurality of sampled data integrators 402, 404, 406, 408, 410, configured in a ladder configuration and providing a low pass transfer function with a corner frequency, $f_d$. The plurality of sampled data integrators 402, 404, 406, 408, 410 are preferably implemented with switched-capacitor integrators, however, other sampled data integrators, such as switched-current integrators, may also be used. The preferred embodiment of the invention, however, will be discussed in terms of switched-capacitor integrators.

Each switched-capacitor integrator 402, 404, 406, 408, 410 is characterized by a unity gain frequency represented by $k_i$. In accordance with the present invention, filter 400 includes a very large time constant (VLTC) integrator 412 to substantially eliminate DC offsets from appearing at an output signal, Vout, of the filter 400. VLTC integrators have a very large ratio between the clock frequency and the integrator unity gain frequency. VLTC integrator 412 provides a zero at DC and a pole at low frequency $(f_l)$, where $f_l$ is lower than upper corner frequency $f_d$ ($f_l < f_d$). For example, frequency ranges 300 hertz (Hz) or less could be used for the lower corner frequency, while frequencies above 3 kilohertz(kHz) could be used for the upper corner frequency.

In FIG. 4, integrator 412 is shown characterized by its unity gain frequency, $k_L$. In accordance with the present invention, the lower corner frequency, $f_l$ can be adjusted as required by changing the unity gain frequency, $k_L$ without substantially altering the frequency response of the remainder of the passband and upper corner frequency, $f_d$. The unity gain frequency of the VLTC integrator 412 in the feedback path 414 is selected to be lower than the unity gain frequencies of the plurality of sampled data integrators.

In accordance with the present invention, VLTC integrator 412 is coupled into a negative feedback path 414 of the first switched-capacitor integrator 402. An AC signal having a DC offset can then be presented as an input signal, Vin, to a non-inverting input 416 of the first switched-capacitor integrator 402, and an integrated output 418 is generated and fed back to an inverting input 420 through the very large time constant integrator 412. The DC offset is subtracted off in the summing junction of the non-inverting and inverting inputs 416, 420 respectively. Thus, the DC is essentially eliminated from the output signal, Vout, of filter 400. While shown in a filter configuration having a plurality of sampled data integrators, the DC blocking technique of the present invention also applies to filters formed of a single sampled data integrator. The VLTC integrator is coupled into a negative feedback path of the sampled data integrator to block DC.

The VLTC integrator 412 can comprise any large time constant sampled-data integrator known in the art, such as a T-cell integrator or that described in a paper by K. Nagaraj, published in *IEEE Transactions on Circuits and Systems*, entitled "A Parasitic-Insensitive Area-Efficient Approach to Realizing Very Large Time Constants in Switched-Capacitor Circuits," Vol. 36, No.9, September, 1989, incorporated herein by reference. Using a VLTC integrator in the feedback path of the first sampled data integrator 402 provides the advantage of blocking DC offsets from appearing at the filter's output.

Figure 1:
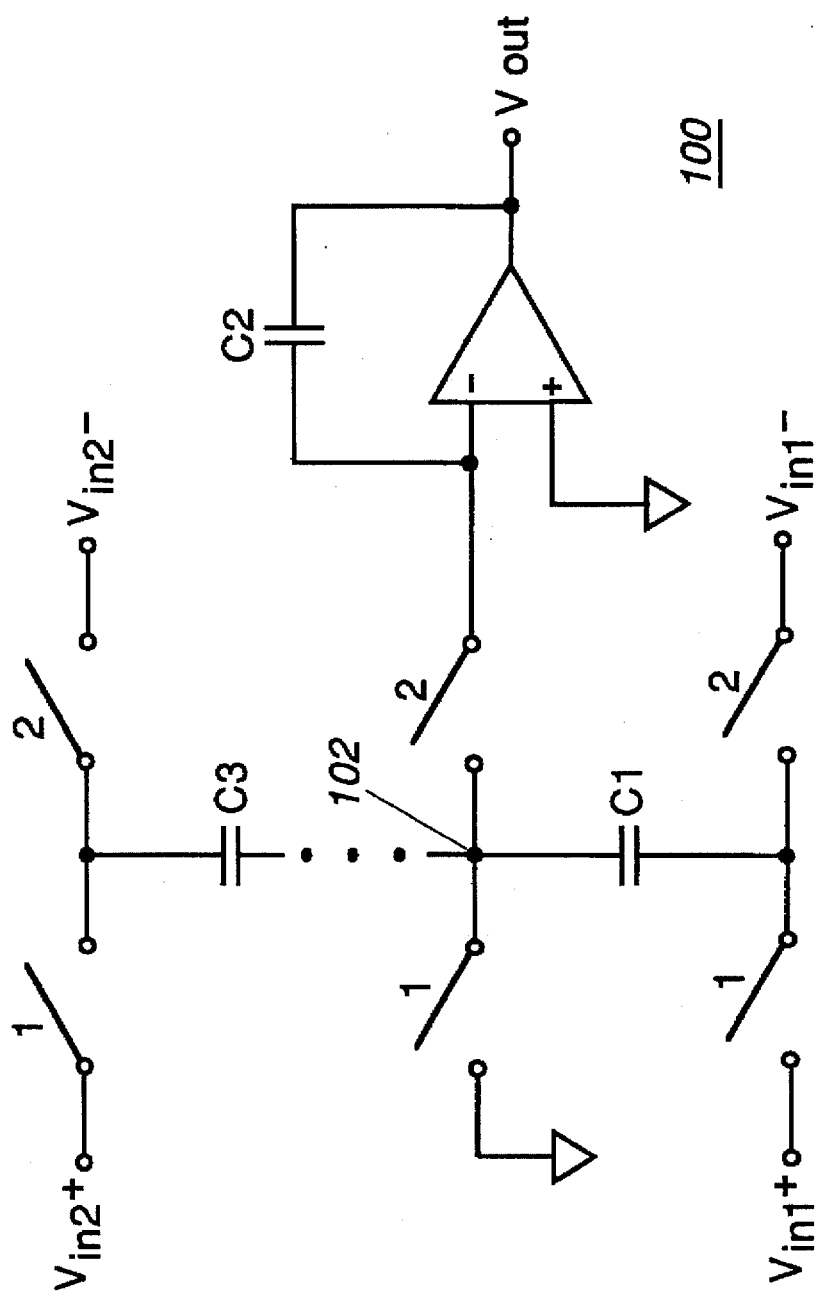
FIG. 1 is a prior art switched-capacitor integrator.
Figure 2:
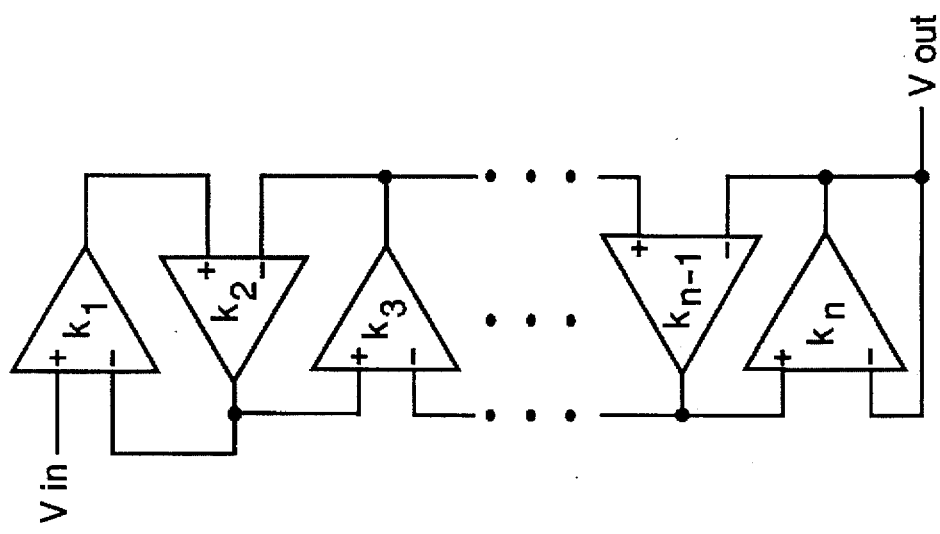
FIG. 2 is a prior art sampled data ladder filter.
Figure 3:
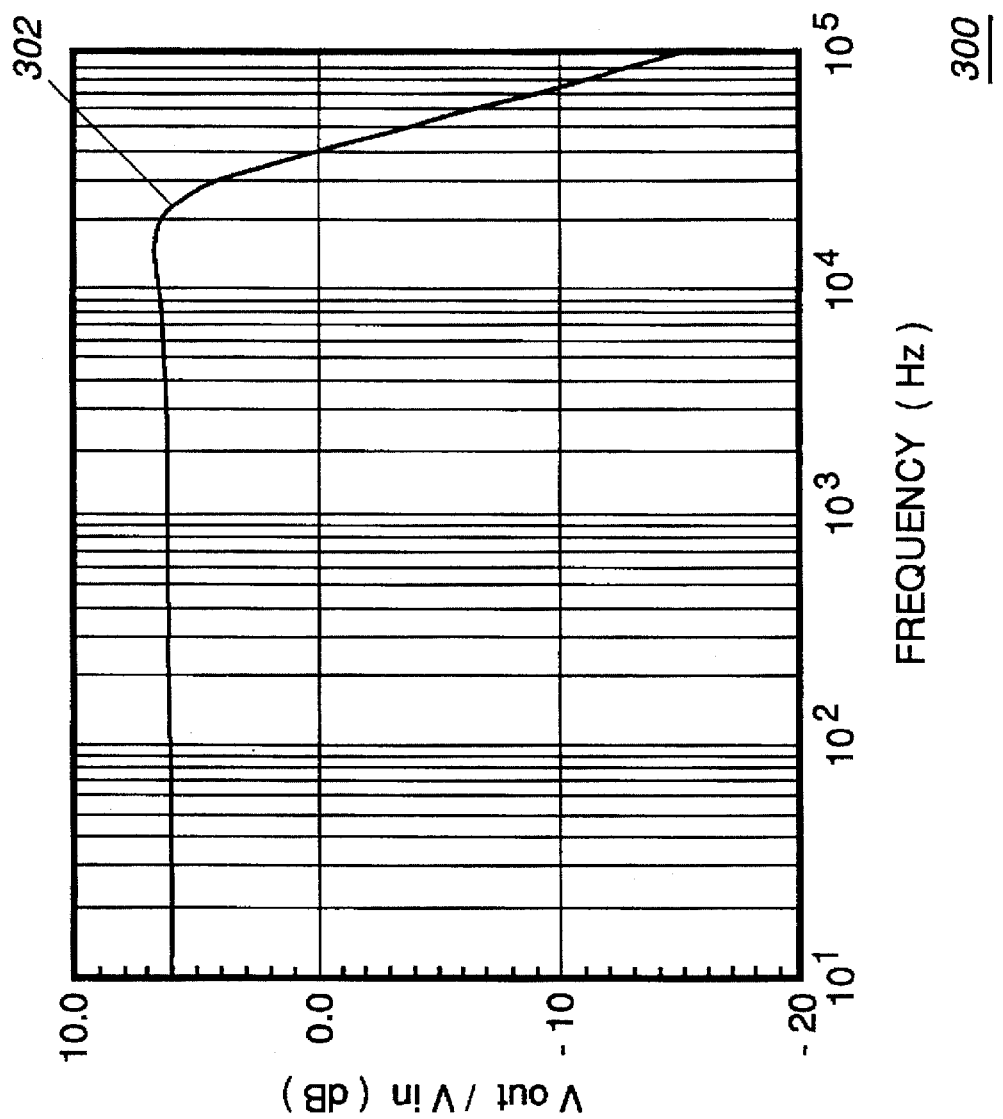
FIG. 3 is an example of a typical frequency response curve for a two pole switched-capacitor ladder filter.
Figure 5:
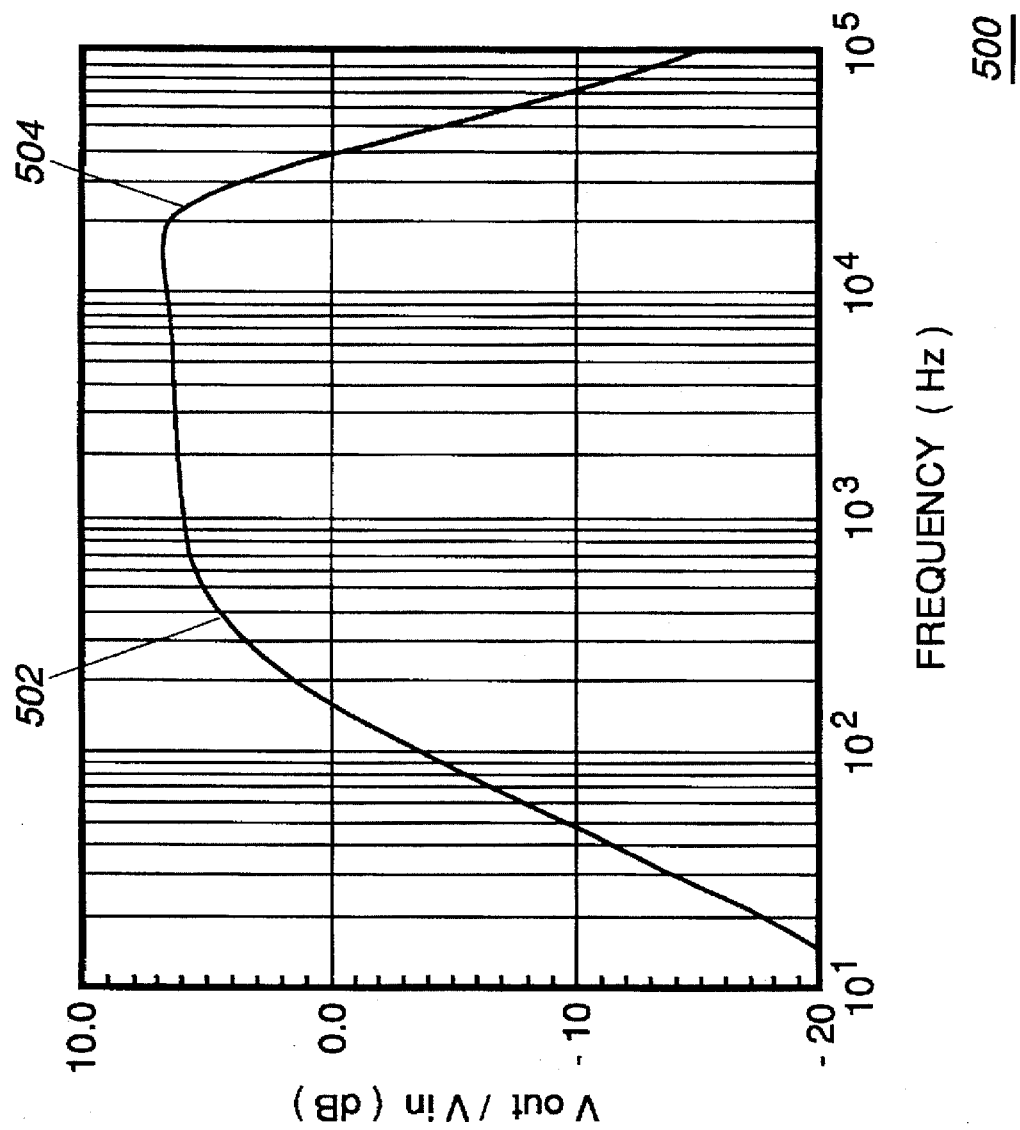
FIG. 5 is a frequency response curve for a two pole integrated switched-capacitor filter formed in accordance with the present invention.

FIG. 5 shows a simulation of a frequency response curve 500 for an integrated two pole switched-capacitor filter having a VLTC integrator in accordance with the present invention. This simulation used the same two pole switched-capacitor filter as that used in the simulation of FIG. 3, but with the addition of a VLTC integrator in the feedback path. Frequency in hertz (Hz) is shown along the horizontal axis while gain in decibels (dB) is shown along the vertical axis. In accordance with the present invention, the VLTC integrator provides a zero at DC and a pole at low frequency ($f_l$) 502, with $f_l$ being lower than $f_d$ 504 ($f_l < f_d$). When compared to the graph of FIG. 3, it is apparent that the passband and upper corner frequency, $f_d$ have been maintained. Thus, on-chip coupling is achieved without substantially altering the frequency response of the desired frequencies of interest. The switched-capacitor filter with VLTC integrator of the present invention allows flexibility to control the lower corner frequency as desired, and blocks DC. All of these benefits are achieved on-chip, maintaining signal integrity.

Hence, by providing an integrated sampled data filter having at least one sampled data integrator characterized by a time constant controlling an upper corner frequency, and then generating a predetermined time constant in the feedback path of the sampled data integrator, this "feed back" time constant being longer than the time constant associated with the sampled data integrator, there has been provided a DC blocking technique which controls a lower corner frequency to the filter. Varying the predetermined time constant of the VLTC integrator controls this lower frequency and provides a zero at DC without disturbing the upper passband frequency response of the filter. If there is a need to move the lower corner frequency substantially closer to the upper corner frequency (into the passband), then pre-distortion of the unity gain frequency of the sampled data integrator can be used to move up the lower corner while maintaining the remaining passband.

The switched-capacitor filter of the present invention can be incorporated into various integrated circuit technologies such as, bipolar-complementary metal oxide semiconductor (Bi-CMOS), gallium arsenide (GaAs), as well as many others. The cost of adding the very large time constant integrator is minimal when compared to the alternatives of adding pin-outs to the ICs and using additional external components. Using the DC blocking technique of the present invention moves technology forward by providing increased integration and on-chip coupling between various circuit stages.

Figure 6:
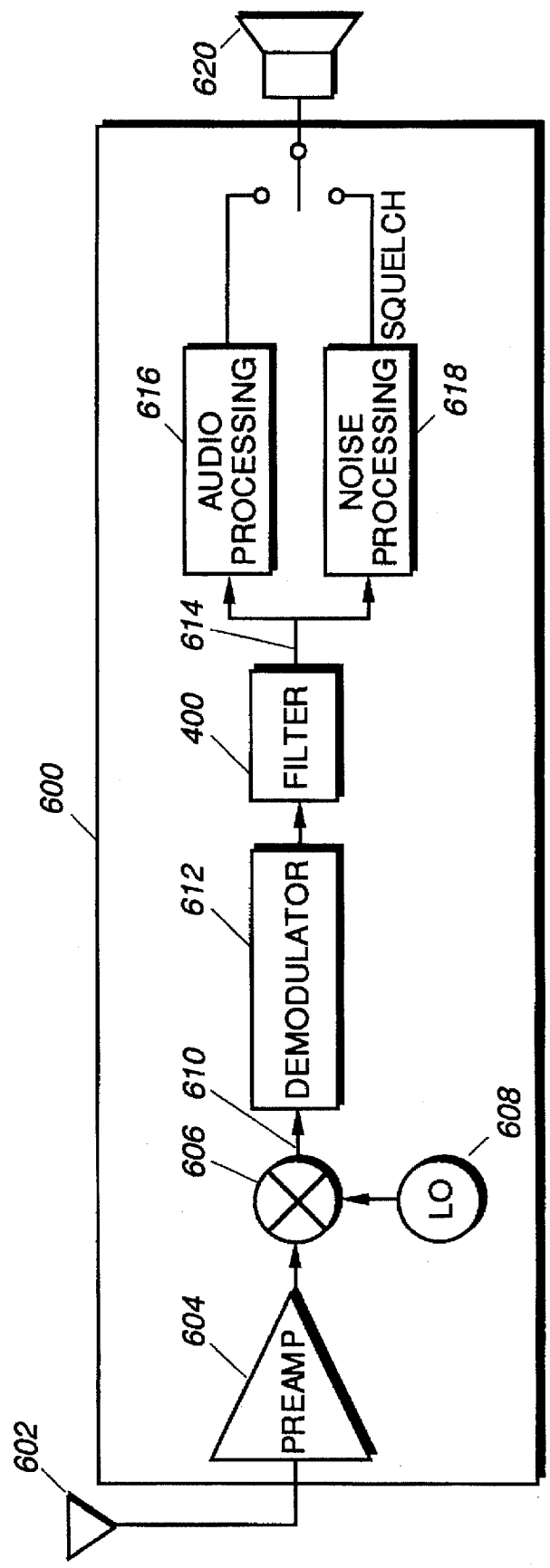
FIG. 6 is a radio receiver block diagram utilizing the filter of the present invention.

Referring now to FIG. 6, there is shown a simplified block diagram of a radio receiver 600. A radio frequency (RF) signal is received at an antenna 602 which is amplified at pre-amp stage 604 and then mixed at mixer 606 with a local oscillator (LO) signal 608 to generate an intermediate frequency (IF) signal 610. IF signal 610 is then demodulated at demodulator 612 and filtered at filter 400 which is formed in accordance with the present invention to remove any DC offsets from the demodulated signal. A filtered signal 614 is then sent to audio and noise processing circuits 616, 618 free of any DC offsets which would otherwise have degraded squelch and audio performance presented at speaker 620. These DC offsets have been eliminated internally to the filter 400 without the use of external components.

Accordingly, there has been provided an integrated sampled data filter which permits on-chip coupling of circuits thereby eliminating at least one IC pad and an external coupling capacitor. Reducing the number of required discrete components incurs the benefits of reduced manufacturing costs, fewer defects, and improved cycle time.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An integrated ladder filter, comprising:

a first sampled data integrator having a non-inverting input and first and second inverting inputs and an output, the non-inverting input receiving an AC signal having a DC offset; and a second sampled data integrator having a non-inverting input coupled to the output of the first sampled data integrator, the second sampled data integrator having an output coupled to the first inverting input of the first sampled data integrator, the second sampled data integrator having an inverting input coupled to the second sampled data integrator output and providing an integrated filter output, the first and second sampled data integrators providing a lowpass frequency response with a predetermined upper corner frequency; and a third sampled data integrator having an input coupled to the output of the first sampled data integrator, and the third sampled data integrator having an output coupled to the second inverting input of the first sampled data integrator, the third sampled data integrator characterized by a unity gain frequency selected such that a transfer function for the integrated filter provides a zero at DC and a pole at a frequency which is lower than the predetermined upper corner frequency.

2. An integrated ladder filter as described in claim 1, wherein the first and second sampled data integrators comprise switched-capacitor integrators.

3. An integrated ladder filter as described in claim 1, wherein the lower corner frequency of the integrated ladder filter can be adjusted by varying the unity gain frequency of the third sampled data integrator.

4. A method of providing DC blocking in an integrated sampled data filter, comprising the steps of:

providing a sampled data ladder filter having a first sampled data integrator and a second sampled data integrator coupled in a ladder configuration, said first and second sampled data integrators providing first and second time constants respectively;

controlling an upper corner frequency of the sampled data filter with the first and second time constants;

providing a very large time constant (VLTC) integrator:

generating a predetermined time constant with the VLTC integrator, the predetermined time constant being longer than the first and second time constants; and providing the predetermined time constant into a feedback path of the first sampled data integrator to generate a lower corner frequency and a zero at DC for the sampled data filter.

5. The method of claim 4, further comprising the step of varying the predetermined time constant to adjust the lower corner frequency of the sampled data filter.

6. A sampled data filter integrated circuit, comprising:

first and second sampled data integrator circuits characterized by first and second unity gain frequencies respectively, the first and second sampled data integrators coupled in a ladder configuration and providing a frequency response having a predetermined upper corner frequency; and a very large time constant (VLTC) integrator having a unity gain frequency which is lower than the first and second unity gain frequencies, the VLTC integrator coupled into a negative feedback path of the first sampled data integrator, the unity gain frequency of the VLTC integrator controlling a pole for a predetermined lower corner frequency of the frequency response, and the VLTC integrator providing a zero at DC for the frequency response.

7. A sampled data filter integrated circuit as described in claim 6, wherein the predetermined lower corner frequency of the frequency response is adjustable by varying the unity gain frequency of the VLTC integrator.

8. An integrated filter, comprising:

a plurality of sampled data integrators coupled in a ladder configuration for providing an upper corner frequency and for receiving an AC signal having a DC offset, the plurality of sampled data integrators including at least a first sampled data integrator; and a very long time constant (VLTC) integrator coupled into a feedback path of the first sampled data integrator, said VLTC integrator controlling a lower corner frequency response of the integrated filter and providing a zero at DC.

9. An integrated filter as described in claim 8, wherein the lower corner frequency response of the integrated filter is adjustable by varying a predetermined time constant of the VLTC integrator.

10. An integrated filter as described in claim 8, wherein the plurality of sampled data integrators comprise switched-capacitor integrators.

11. An integrated filter as described in claim 8, wherein the plurality of sampled data integrators comprise switched-current integrators.

12. A radio, including:

a receiver for receiving a radio frequency (RF) signal and converting it to an audio signal, said receiver including an integrated filter providing DC blocking, said integrated filter comprising:

a plurality of sampled data integrators configured in a ladder formation, the plurality of sampled data integrators controlling an upper corner frequency of the integrated filter; and a very large time constant (VLTC) integrator coupled into a negative feedback path of the first sampled data integrator of the plurality of sampled data integrators, the VLTC integrator controlling a lower corner frequency of the integrated filter and the VLTC integrator providing a zero at DC.

13. A radio as described in claim 12, wherein the plurality of sampled data integrators comprises switched-capacitor integrators.

* * * * *